(12) United States Patent  
Dalt

(10) Patent No.: US 6,738,449 B2  
(45) Date of Patent: May 18, 2004

(54) PROGRAMMABLE FRACTIONAL FREQUENCY DIVIDER

(75) Inventor: Nicola Da Dalt, Villach (AT)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/153,365

(22) Filed: May 22, 2002

(65) Prior Publication Data

US 2003/0020523 A1 Jan. 30, 2003

(30) Foreign Application Priority Data

May 22, 2001 (DE) .......................................... 101 25 155

(51) Int. Cl.[7] .............................................. H03K 21/00
(52) U.S. Cl. ....................................................... 377/48
(58) Field of Search ............................................. 377/48

(56) References Cited

U.S. PATENT DOCUMENTS 5,477,196 A    12/1995  Yamauchi et al. ............ 331/60
6,157,694 A  * 12/2000  Larsson ........................ 377/48

OTHER PUBLICATIONS

Nagendra Krishnapura and Peter R. Kinget, *A 5.3–GHz Programmable Divider for HiPerLAN in 0.25–μm CMOS*, IEEE Journal of Solid–state Circuits, vol. 35, 7:1019–1024 (2000).

* cited by examiner

*Primary Examiner*—Margaret Wambach  
(74) *Attorney, Agent, or Firm*—Fish & Richardson, PC

(57) ABSTRACT

The invention features a fractional frequency divider including a phase selection device where mutually phase-shifted signals are alternately switched through to a phase output, at the input of the phase selection device; and a control device for selecting individual phases where the control device changes the mutually phase-shifted signals.

19 Claims, 4 Drawing Sheets

PROGRAMMABLE FRACTIONAL FREQUENCY DIVIDER

Pursuant to 35 U.S.C. 119(a)–(d), this application claims priority from German application no. 10125155.6, filed on May 22, 2002.

FIELD OF THE INVENTION

The invention relates to a fractional frequency divider.

BACKGROUND OF THE INVENTION

Frequency dividers are used, for example, in frequency synthesizers to provide signals in stepped frequencies.

One field of application for frequency dividers are, e.g. PLL (Phase Locked Loop) circuits as used in mobile radio technology. In these circuits, a number of communication channels are only a few 100 kHz apart from one another in the GHz band, and the PLL circuit must be capable of generating output frequencies which are precisely synchronized to these channels. As a rule, a fractional frequency divider is used in the feedback path of the PLL circuits.

Another field of application for frequency dividers is, for example, digital signal processing and microprocessor technology. In the case of signal processing devices, it is often a requirement to clock different modules with different frequencies which are a few MHz apart from one another (e.g. from 70 MHz to 170 MHz). A register or processor operating, e.g. at a maximum frequency of 152 MHz can only be operated optimally if exactly this clock frequency is provided, if possible. If, e.g. only 2 different frequencies, for instance 120 MHz and 170 MHz, are available, one is forced to operate the processor at 120 MHz, as a result of which 32 MHz of performance are lost. Using a frequency synthesizer which covers the range between 120 MHz and 170 MHz in 10-MHz steps, the microprocessor can be operated at 150 MHz and only 2 MHz of performance are lost.

These examples show that frequency dividers capable of dividing a predetermined input frequency not only by an integral factor N but also by fractions thereof, namely N+m/k, are required.

In communication technology, the feedback-type dual mode divider is widely used. This divider is capable of dividing a supplied input signal with a frequency Fin either by a factor N or by N+1. Programming the divider so that it divides a predetermined number of input clock cycles by N and then a number of clock cycles by N+1 makes it possible, in principle, to obtain an average output frequency in the entire frequency range between Fin/N and Fin/(N+1). The disadvantages of this frequency divider are, however, that no frequency outside the range of Fin/N and Fin/(N+1) can be covered. Due to the unequal dividing factors, the output signal exhibits jitter around the desired average frequency. This may no longer be tolerable for certain applications.

Another possibility for generating variable frequencies in steps of a few MHz is using a signal generator which outputs very high frequencies (in the GHz range) and then to divide these frequencies by integral factors. This would lead to smaller-value frequencies which are spaced apart more or less uniformly within a certain range. The main disadvantages of this solution are that a signal generator in the GHz range has to be provided and the system requirements for frequency dividers for the GHz range are relatively high.

FIG. 1 shows an example of a known fractional frequency divider. The fractional divider comprises essentially a phase selection device 1, a control unit 2, and an N-tuple divider 3.

At the input of the phase selection device 1, a number of phase-shifted signals ph1–ph6 are present which are switched through to the output of the phase selection device 1 in dependence on the switched position of the switches S1–S6. The individual phases ph1–ph6 are thus in each case output for a particular period at the output 5 of the phase selection device 1. Finally, the phase signal output is divided by an integral factor N by the N-tuple divider 3.

The switches S1–S6 are successively switched by the control unit 2 in descending order (only one of the switches being closed at any time). The control unit 2 consists of a number of K, six in the present case, registers FF1–FF6 which are arranged in the form of a circle.

The total dividing factor of such a fractional divider is N+m/k, where k is the number of phases and m a parameter which depends on how the individual phases ph1–ph6 are connected to the phase selection device 1.

At the beginning, the K registers are initialized in such a way that the signal output Q of only one of the registers FF1–FF6 is set to high (logical 1) whereas the outputs Q of all other registers FF1–FF6 are set to low (logical 0). In the example shown, the signal output Q of the fifth register FF5 shows a logical 1 signal whereas the outputs Q of all other registers show a logical 0 signal.

The outputs Q of the registers FF1–FF6 directly control the switches S1–S6 which switch the supplied phases ph1–ph6 through to the common node ph-out.

The clock inputs CK of the registers FF1–FF6 are connected to the output of the N-tuple divider and shift the signal present at the signal input D forward to the signal output Q with each rising edge of the clock signal.

Depending on the position of the logical 1 value, therefore, only one of the phases ph1–ph6 is switched through to the output ph-out at a particular time.

The divided-down output signal Fout is identical with the clock shifter signal present at the clock inputs CK of the registers FF1–FF6.

FIG. 2 shows the variation with time of the individual signals of the system. The individual phases Ph1–Ph6 have in each case the same period and are phase-shifted by 60° with respect to one another. The phase shift is calculated generally as Tin/k where Tin is the period and k is the number of phases. If the phases are present at the phase selection device 1 as shown in FIG. 3, the period of the output signal is Tout=N·Tin-Tin/k or, respectively, Fout=Fin/(N-1/k).

As mentioned, k is here the number of phases and m is a parameter which depends on how the individual phases ph1–ph6 are connected to the phase selection device 1. If the phases were connected in the order ph6, ph4, ph2, a dividing factor of 2−2/6 would be obtained (with N=2, k=6 and m=−2). The order of ph1, ph2, ph3, ph4, ph5, ph6, instead, would result in a factor of 2+1/6.

The known fractional frequency divider has the essential disadvantage that changing the dividing factor always requires changing the interconnection.

SUMMARY OF THE INVENTION

It is, therefore, the object of the present invention is to create a fractional frequency divider whose the dividing ratio can be variably adjusted.

The essential concept of the invention consists in constructing the frequency divider to be programmable so that certain ones (not necessarily all) of the connected phases can be selected and/or the phases can be switched through to the output of the phase selection device in any order.

For this purpose, the fractional frequency divider according to the invention preferably comprises a programmable control device.

According to a preferred embodiment of the invention, the programmable control device has a number of shift registers which are in each case connected to a pulse shifter network. In this arrangement, the signal inputs and outputs of each register are preferably connected to the pulse shifter network. Using the pulse shifter network, an output signal present at a register can be forwarded to any other register.

The signal inputs and outputs of the individual registers are preferably not connected to one another directly as in the case of the frequency divider from the prior art.

According to a preferred embodiment of the invention, a frequency divider which divides the frequency of the output phase by a factor N is provided at the output of the phase selection device. This dividing factor N is preferably adjustable and, in particular, programmable.

The N-tuple divider is preferably connected to the clock input of the individual registers which are supplied with the phase, divided by the factor N, as the clock signal.

According to an embodiment of the invention, the pulse shifter network is constructed of multiplexers.

Furthermore, a decoder can be connected to the pulse shifter network, which converts signals supplied from the outside to the input of the pulse shifter network.

BRIEF DESCRIPTION OF THE DRAWINGS

In the text which follows, the invention will be explained in greater detail with reference to the attached drawings.

In the figures, identical reference symbols designate identical or functionally identical components.

DETAILED DESCRIPTION

Figure 1:
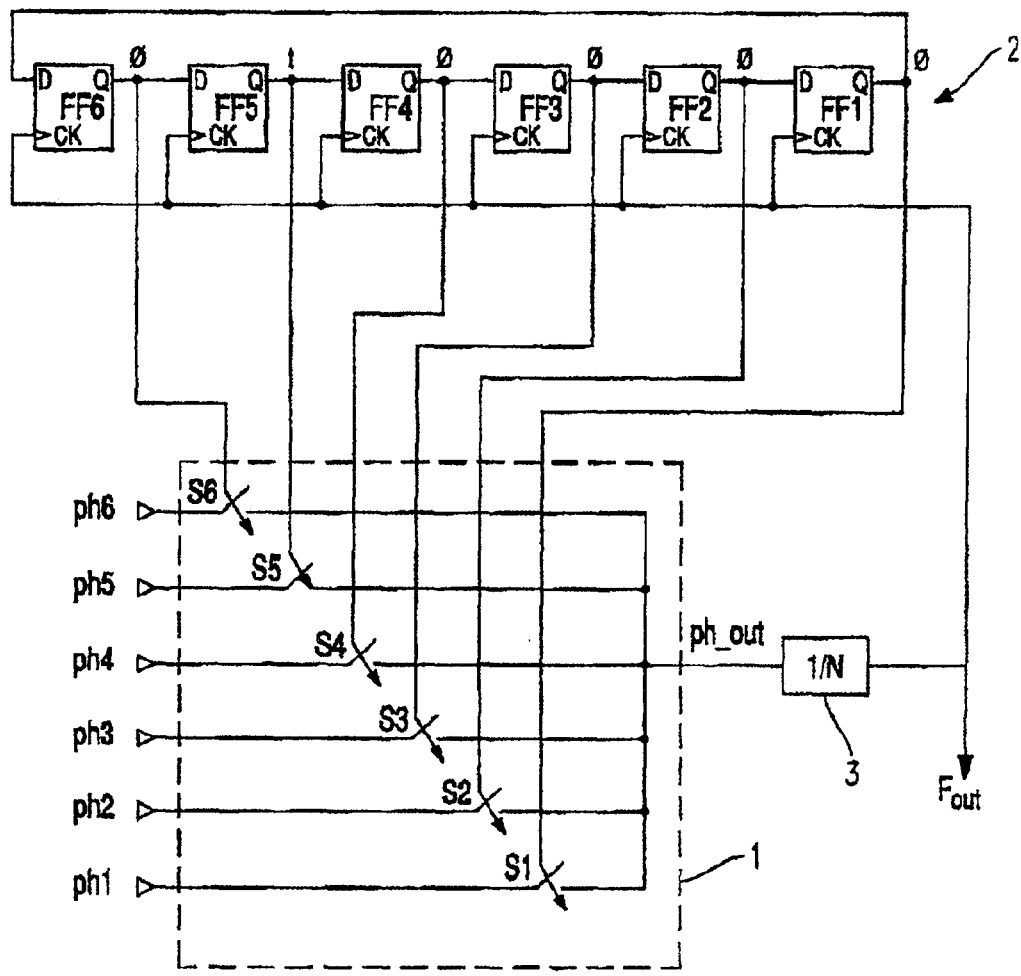
FIG. 1 shows a known frequency divider according to the prior art.
Figure 2:
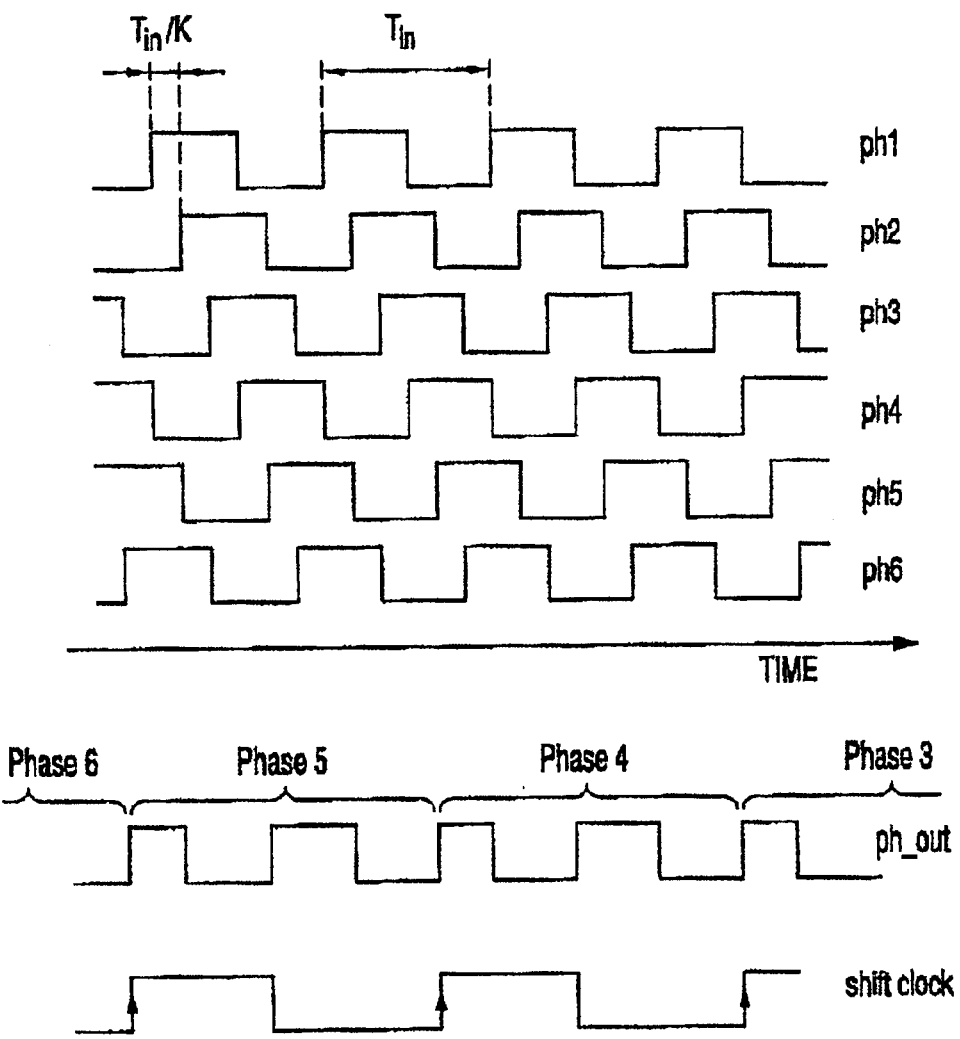
FIG. 2 shows timing diagrams of signals in the known frequency divider according to FIG. 1.
Figure 3:
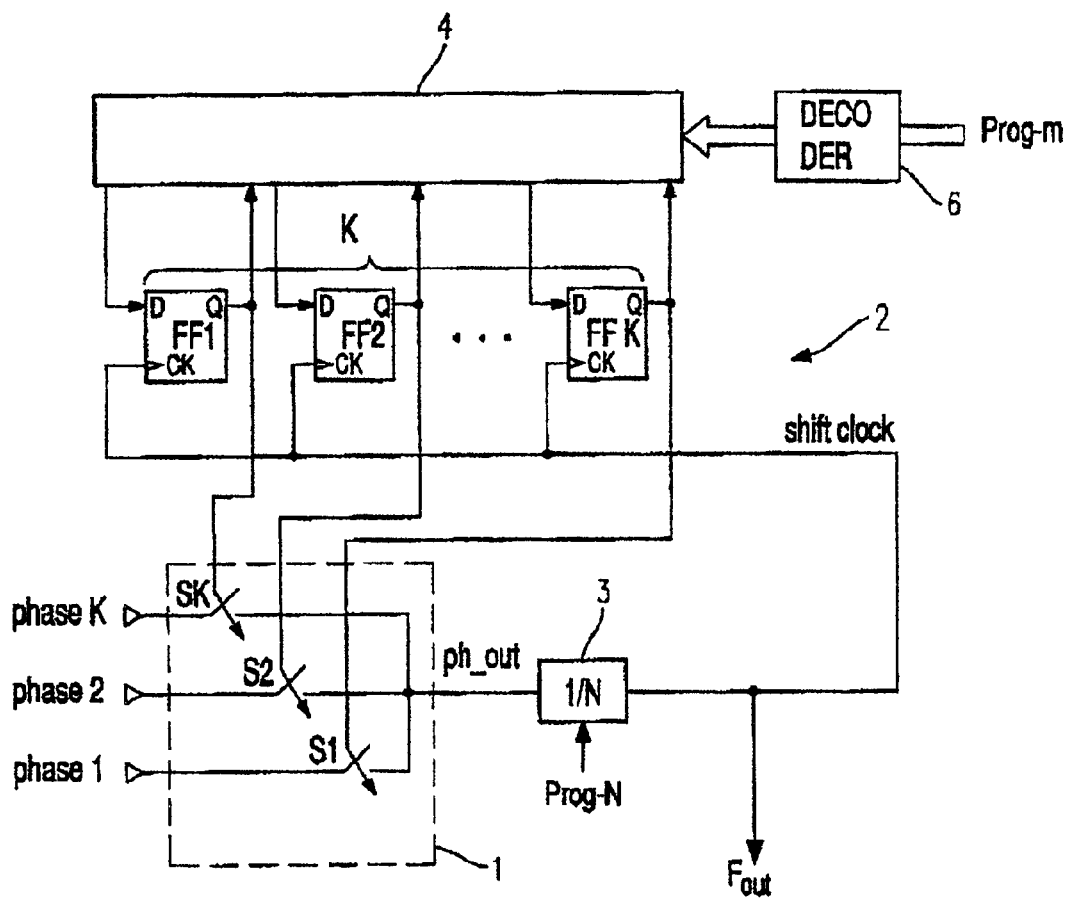
FIG. 3 shows the diagrammatic structure of a fractional frequency divider according to the invention.

FIG. 3 shows a possible architecture of a programmable fractional frequency divider according to the invention. The frequency divider essentially comprises a phase selection device 1, a control unit 2 and a programmable N-tuple frequency divider 3.

At the input of the phase selection device 1, a number of phase signals ph1–ph6 are present which can be switched through to the output ph_out of the phase selection device 1 in dependence on the switched position of the switches S1–Sk. The phase output at the output ph_out is supplied to an N-tuple frequency divider. The output signal of the N-tuple divider 3 is used for clocking the shift registers FF1–FFk.

The control unit 2 is capable, by driving the corresponding switches S1–SK, of selecting certain ones of the phases ph1–phk and of determining the order in which they are switched through to the output. As a result, both the parameter k determining the total dividing factor and the parameter m can be influenced.

The control unit 2 comprises a number of registers FF1–FFK which are in each case connected to the pulse shifter network 4. In contrast to the known arrangement shown in FIG. 3, the individual shift registers FF1–FFK are not interconnected with one another in a circle but receive their input signals from and send their output signals into the pulse shifter network 4.

The control unit 2 also comprises a decoder, at the input of which a data bus is connected. After converting the received signals, the output of the decoder 6 controls the operation of the pulse shifter network 4.

The dividing factor N of the N-tuple frequency divider is programmable.

Figure 4:
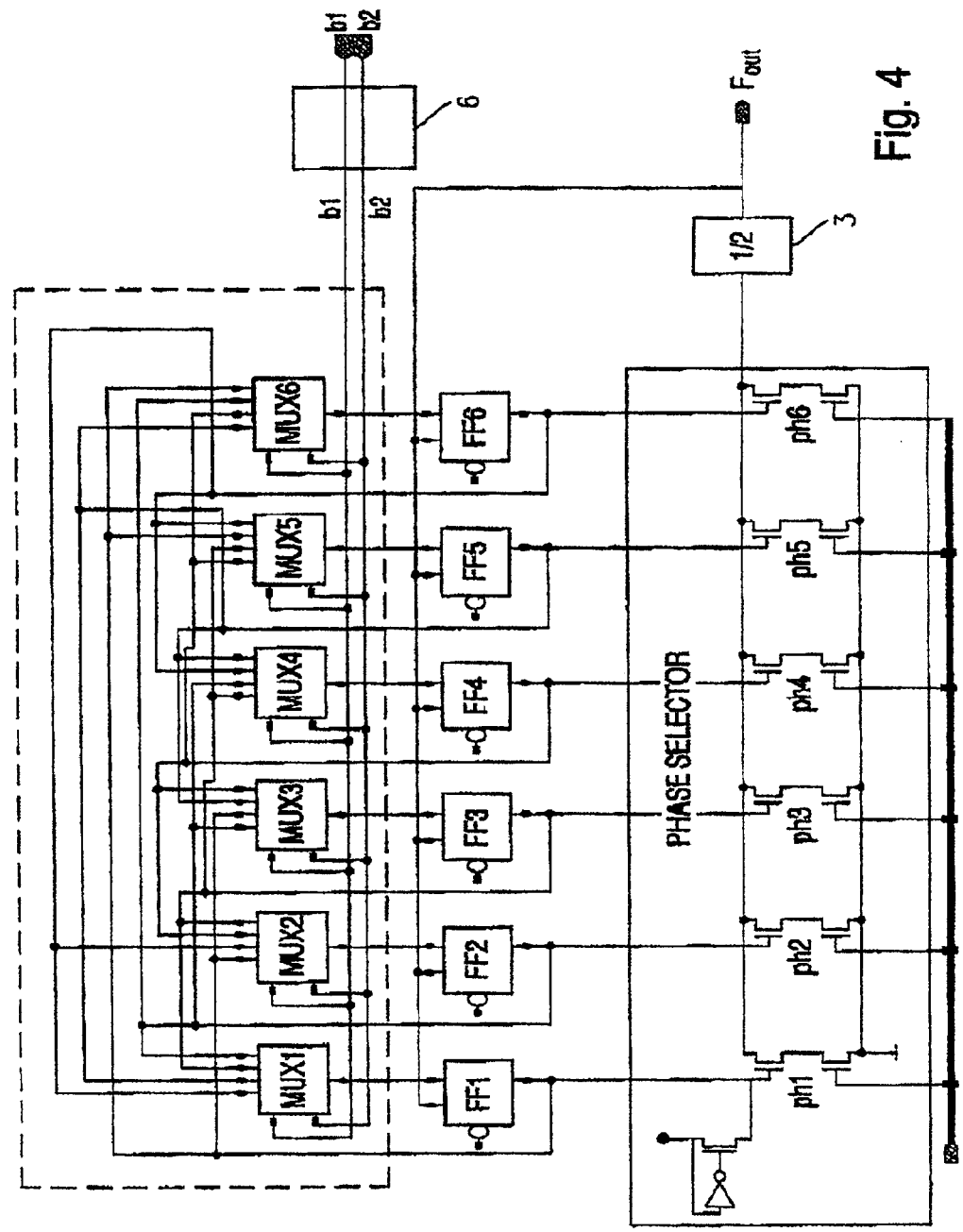
FIG. 4 shows a preferred embodiment of the frequency divider according to the invention of FIG. 3.

FIG. 4 shows a preferred embodiment of a programmable frequency divider according to the invention, the pulse shifter network 4 of which comprises a number of multiplexers MUX. In this case, the programmable fractional frequency divider has a dividing factor of 2+m/6 since a total of six phases ph1–ph6 are connected to the phase selection device 1.

The switches S1–S6 are constructed as MOS transistors in this case. The dividing factor of the N-tuple divider is N=2.

The multiplexers MUX1-MUX6 are in each case controlled by two bits which are output by the decoder 6. The decoder 6 has two inputs so that, in this case, it only represents a "transparent" unit which passes through the input signals.

The interconnection of the registers FF1–FF6 can be changed in dependence on the control bits B0, B1 supplied to the inputs S0, S1 of the multiplexers MUX1–MUX6, as a result of which, e.g. the second register FF2 can be connected to the fifth one FF5 and this, in turn, can be connected to the third one FF3 etc.

With two control bits, a total of four different interconnections of the registers FF1–FF6 are possible. For example, the connected phases ph1–ph6 can be interconnected in specified in the table below, as a result of which corresponding dividing factors are obtained.

| Program | Phase sequence | | Dividing factor |
|---|---|---|---|
| 00 | 5 | 6 | 2 + 1/6 |
| 01 | 3 | 5 | 2 + 2/6 |
| 10 | 3 | 2 | 2 − 1/6 |
| 11 | 5 | 3 | 2 − 2/6 |

What is claimed is:

1. A fractional frequency divider comprising:
   a phase selection device configured to alternately switch one of a plurality of phase-shifted phase signals through to a phase output thereof; and
   a control device configured to control switching of the phase signals by the phase selection device, wherein the control device comprises a pulse shifter network and a plurality of shift registers.

2. The fractional frequency divider of claim 1, wherein the control device is configured to change the order of the phase signals being switched through to the phase output of the phase selection device.

3. The fractional frequency divider of claim 1, wherein the control device is programmable.

4. The fractional frequency divider of claim 1, wherein signal inputs and outputs of the shift registers are connected to the pulse shifter network.

5. The fractional frequency divider of claim 1, wherein signal inputs and outputs of the shift registers are disconnected from one another.

6. The fractional frequency divider of claim 1, further comprising an N-tuple divider connected to the output of the phase selection device, the N-tuple divider being configured to divide a signal at the phase output by an integral dividing factor N.

7. The fractional frequency divider of claim 1, wherein the dividing factor N of the N-tuple divider is programmable.

8. The fractional frequency divider of claim 6, wherein an output of the N-tuple divider is connected to clock inputs of shift registers.

9. The fractional frequency divider of claim 1, wherein the pulse shifter network comprises a plurality multiplexers.

10. The fractional frequency divider of claim 1, further comprising a decoder in communication with the pulse shifter network.

11. A fractional frequency divider comprising:
  a phase selection device configured to alternately switch one of a plurality of phase-shifted phase signals through to a phase output thereof;
  an N-tuple divider connected to the output of the phase selection device, the N-tuple divider being configured to divide a signal at the phase output by an integral dividing factor N, the N-tuple divider having an output connected to clock inputs of shift registers; and
  a control device configured to control switching of the phase signals by the phase selection device.

12. The fractional frequency divider of claim 11, wherein the dividing factor N of the N-tuple divider is programmable.

13. The fractional frequency divider of claim 11, wherein the control device is configured to change the order of the phase signals being switched through to the phase output of the phase selection device.

14. The fractional frequency divider of claim 11, wherein the control device is programmable.

15. The fractional frequency divider of claim 11, wherein the control device comprises a pulse shifter network and a plurality of shift registers.

16. The fractional frequency divider of claim 15, wherein signal inputs and outputs of the shift registers are connected to the pulse shifter network.

17. The fractional frequency divider of claim 15, wherein signal inputs and outputs of the shift registers are disconnected from one another.

18. The fractional frequency divider of claim 15, wherein the pulse shifter network comprises a plurality of multiplexers.

19. The fractional frequency divider of claim 15, further comprising a decoder in communication with the pulse shifter network.

* * * * *